US008289336B2

(12) United States Patent
Kuhwald et al.

(10) Patent No.: US 8,289,336 B2
(45) Date of Patent: Oct. 16, 2012

(54) SYSTEM AND METHOD FOR PROCESSING AND REPRESENTING A SAMPLED SIGNAL

(75) Inventors: Thomas Kuhwald, Dietramszell (DE); Florian Janku, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1224 days.

(21) Appl. No.: 11/836,447

(22) Filed: Aug. 9, 2007

(65) Prior Publication Data

US 2008/0036726 A1 Feb. 14, 2008

(30) Foreign Application Priority Data

Aug. 9, 2006 (DE) .......................... 10 2006 037 221

(51) Int. Cl.
  G09G 5/39 (2006.01)
  H03M 1/12 (2006.01)
  H03H 11/26 (2006.01)
  G01R 13/00 (2006.01)
(52) U.S. Cl. ........... 345/532; 341/155; 327/261; 702/66
(58) Field of Classification Search .................. 345/532; 341/155; 327/261; 702/66
  See application file for complete search history.

(56) References Cited

U.S. PATENT DOCUMENTS

| 3,484,689 | A | | 12/1969 | Kerns | |
|---|---|---|---|---|---|
| 4,763,105 | A | * | 8/1988 | Jenq | 341/120 |
| 5,180,971 | A | * | 1/1993 | Montijo | 324/121 R |
| 5,294,926 | A | * | 3/1994 | Corcoran | 341/120 |
| 5,506,635 | A | | 4/1996 | Vorwerk | |
| 5,745,394 | A | * | 4/1998 | Tani | 708/313 |
| 6,057,853 | A | * | 5/2000 | Siegel et al. | 345/600 |
| 6,121,799 | A | * | 9/2000 | Moser | 327/58 |
| 6,195,080 | B1 | * | 2/2001 | Etheridge | 345/440.1 |
| 6,219,029 | B1 | * | 4/2001 | Flakne et al. | 345/690 |
| 6,522,282 | B1 | * | 2/2003 | Elbornsson | 341/155 |
| 6,549,859 | B1 | * | 4/2003 | Ward | 702/66 |
| 6,809,668 | B2 | * | 10/2004 | Asami | 341/120 |
| 6,832,174 | B2 | * | 12/2004 | Tran et al. | 702/121 |
| 6,836,235 | B2 | * | 12/2004 | Asami | 341/155 |
| 6,912,474 | B2 | * | 6/2005 | Richmond | 702/125 |
| 7,049,872 | B2 | * | 5/2006 | Diorio et al. | 327/276 |

(Continued)

FOREIGN PATENT DOCUMENTS

GB 2 056 825 3/1981

OTHER PUBLICATIONS

German Search Report Nov. 21, 2006.

*Primary Examiner* — Daniel Washburn
(74) *Attorney, Agent, or Firm* — Ditthavong Mori & Steiner, P.C.

(57) ABSTRACT

In an system for representing a signal on a display device, the signal is fed to a first sampling device and, time-displaced via a time-delay device, is fed at least to a second sampling device for sampling. The sampling values of the first sampled signal and the sampling values of the second sampled signal are appropriately ordered in a first memory control device of a first component connected to the first sampling device in order to compensate a time-delay of the sampling values of the second sampled signal caused by the time-delay device, and are passed to a post-treatment device provided in the first component and connected to the display device.

7 Claims, 2 Drawing Sheets

U.S. PATENT DOCUMENTS

| | | | |
|---|---|---|---|
| 7,126,511 B2 * | 10/2006 | Draxelmayr et al. | 341/136 |
| 7,148,828 B2 * | 12/2006 | Fernandez et al. | 341/120 |
| 7,206,722 B2 * | 4/2007 | Pickerd et al. | 702/190 |
| 7,219,174 B2 * | 5/2007 | Gerlach et al. | 710/65 |
| 7,285,948 B2 * | 10/2007 | Tran et al. | 324/750.01 |
| 7,305,312 B2 * | 12/2007 | Hamre et al. | 702/69 |
| 7,315,593 B2 * | 1/2008 | Hagen et al. | 375/355 |
| 7,398,175 B2 * | 7/2008 | Tran et al. | 702/121 |
| 7,446,875 B2 * | 11/2008 | Wake et al. | 356/432 |
| 2001/0037189 A1 * | 11/2001 | Onu et al. | 702/191 |
| 2006/0279445 A1 * | 12/2006 | Kinyua et al. | 341/155 |
| 2007/0262895 A1 * | 11/2007 | Stein et al. | 341/155 |

* cited by examiner

SYSTEM AND METHOD FOR PROCESSING AND REPRESENTING A SAMPLED SIGNAL

This present application claims priority of German Patent Application No. 10 2006 037 221.2, filed on Aug. 9, 2006, the entirety of which are hereby incorporated by reference.

FIELD OF THE INVENTION

The present invention, according to various embodiments, relates to an arrangement and a method for representing a sampled signal on a display device, in particular a display device of a digital oscilloscope.

BACKGROUND OF THE INVENTION

In order to represent a time-continuous signal on a display device, in particular on a display device of a digital oscilloscope, a time-discrete signal is obtained by sampling the amplitude of the signal at discrete, generally equidistant points in time, which signal is converted for example into a time-discrete and value-discrete digital signal in a post-treatment stage and can be stored and/or represented on the display device of the oscilloscope.

The sampling of the signal takes place at periodic time intervals with a predetermined number of samplings per unit time. The number of samplings per unit time is termed the sampling rate. A comparatively high sampling rate is necessary in order to represent a high-frequency signal.

Particularly high sampling rates are necessary not only in oscilloscopes for sampling high-frequency signals, but also in transient recorders, which are systems for the data storage of measurement records in the high-speed range. A transient recorder for the digitisation of rapid signal profiles is known for example from the printed specification DE 37 24 794 A1.

SUMMARY OF THE INVENTION

In accordance with various embodiments of the present invention, a system and a method are provided for representing a sampled signal on a display device, whereby the sampled signal can be represented with a particularly high degree of accuracy and in a technically particularly simple manner on the display device.

One embodiment of the invention comprises the features of claim 1. Advantageous modifications are the subject-matter of the subclaims dependent thereon.

Another embodiment of the invention comprises the features of claim 5. Advantageous modifications are the subject-matter of the subclaims dependent thereon.

Accordingly to another embodiment, the method comprises a sampling of the signal. The signal is on the one hand sampled without any time-delay, i.e. immediately after the signal has been picked up. The sampling values of the first sampled signal obtained in this sampling are fed to a first memory control device of a first component for further processing. On the other hand the signal is sampled in a time-displaced manner with a time-delay. The sampling values of the second time-displaced sampled signal obtained in this sampling are fed to the first memory control device. In order to represent the signal on the display device, the sampling values of the first sampled signal and the sampling values of the second, time-displaced sampled signal are combined and arranged in order with respect to one another in the first memory control device in such a way that the sampling values of the second, time-displaced sampled signal together with the sampling values of the first sampled signal form a signal simulating the analog signal. After the combination of the signals the sampling values of the first sampled signal and the sampling values of the second sampled signal are post-treated in the first component for the representation on the display device.

According to another embodiment of the invention, a system for carrying out the method, comprises a first sampling device, to which the signal is passed without any time-delay, and at least a second sampling device to which the signal, time-displaced by means of a time-delay device, is passed. To this end the time-delay device is connected upstream of the second sampling device. The sampling values of the first sampled signal and the sampling values of the second, time-displaced sampled signal are passed to the first memory control device of the first component. The sampling values of the first sampled signal and the sampling values of the second, time-displaced sampled signal are appropriately combined in the first memory control device in order to compensate the time-delay, caused by the time-delay device, of the sampling values of the second time-displaced sampled signal. In addition the arrangement comprises a post-treatment device, which is connected to the first memory control device and to the display device and serves for the post-treatment of the combined sampling values.

The advantages achieved with certain embodiments of the invention provides in particular that, by means of a cascading of the first component as well as of the second or more further components as regards the feeding of the sampling values of the signal, which are sampled in a time-displaced manner with respect to one another from one component to the other component, a particularly high resultant sampling rate can be achieved. Furthermore, the sampling rate for the sampling of the monitored signal is raised by the factor of the components which can be realized in a technically particularly simple manner in the arrangement according to the invention. Moreover, a time-displaced sampling of the monitored signal with the cascade-arranged sampling devices can be achieved in a technically particularly simple and reliable manner by the delay device, which is connected upstream of the corresponding sampling device for the delay of the signal that can be fed to this sampling device. In addition the system according to an embodiment of the invention and the method according to an embodiment of the invention can be realized without great technical effort and expenditure for any arbitrary number of cascade-arranged components. Apart from this, the requirement of simply a single post-treatment device for the post-treatment of the sampling values combined in the first memory control device is a particularly cost-saving feature.

According to another embodiment, the system includes a second component, to which the sampling values of the second sampled signal are fed. Conveniently a second memory control device is provided in the second component, whereby the sampling values of the second sampled signal fed to the second component are passed on to the first memory control device.

According to another embodiment, the system comprises a channel control device, whereby the sampling values of the second sampled signal are collected and passed to the first memory control device in the first components. By means of the channel control device the sampling values of the first sampled signal can advantageously be combined in a particularly convenient and reliable manner in the first memory control device with the sampling values of the second sampled signal received from the channel control device.

According to another embodiment, the first memory control device and the second memory control device are also designed so that the sampling values of the first sampled signal and the sampling values of the second sampled signal can be temporarily stored in the first component and in the second component According to another embodiment, the system includes in the first component a first memory device and in the second component a second memory device, in which and from which the sampling values of the first sampled signal governed by the first memory control device and the sampling values of the second sampled signal governed by the second memory control device can be temporarily stored and retrieved.

According to another embodiment, the system comprises a multiplexer device, which is provided on the input side in the first and/or the second component. Sampling values of one or more sampling devices connected to the first component and to the second component are passed to the multiplexer device. The sampling values are preferably time-displaced with respect to one another by connecting delay devices upstream of the sampling devices. The multiplexer device passes the sampling values as appropriate to the first memory control device and to the second memory control device.

According to another embodiment, the first sampling device and the second sampling device in each case comprise an analog-digital converter.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF THE PREFERRED EMBODIMENTS

Figure 1:
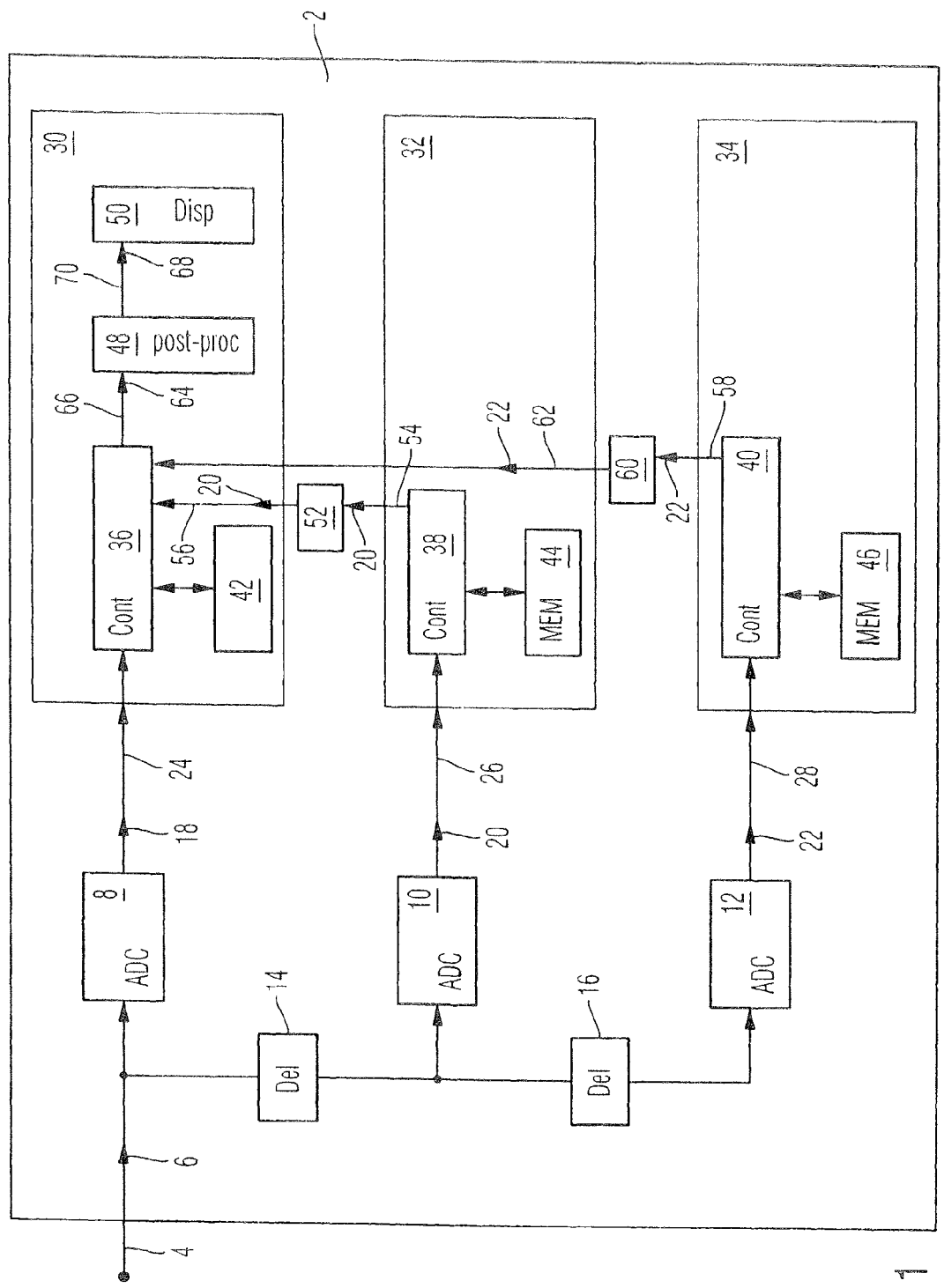
FIG. 1 shows a first embodiment of an arrangement with a cascade of three components connected to sampling devices, for recording measured sampling values in the components and for a post-processing of the sampling values in one of the components, according to an exemplary embodiment.

FIG. 1 shows in a first embodiment an arrangement 2 with an input line 4, via which a signal 6 to be represented and identified in FIG. 1 by an arrow is fed to the arrangement 2. To sample the signal 6 the arrangement 2 comprises sampling devices 8, 10, 12. The signal 6 is passed to the sampling device 8 on the input side without a time-delay, for coupling into the arrangement 2. In contrast to this the signal 6 fed to the sampling device 10 on the input side is time-delayed at a time-delay device 14. The signal 6 fed to the sampling device 12 on the input side is time-delayed at the time-delay device 14 and in addition at a time-delay device 16. At the sampling devices 8, 10, 12 sampling values 18, 20, 22, identified in FIG. 1 by arrows, are made available to the components 30, 32, 34 via signal lines 24, 26, 28 which connect the sampling devices 8, 10, 12 and the components 30, 32, 34.

The components 30, 32, 34 comprise respectively a memory control device 36, 38, 40 and respectively a memory device 42, 44, 46 connected to the memory control device 36, 38, 40, for the temporary storage of the sampling values 18, 20, 22. The component 30 comprises in addition to the memory control device 36 and the memory device 42, also a post-treatment device 48 and a display device (display) 50.

The sampling values 18, 20, 22 are passed to the memory control devices 36, 38, 40 and are governed by these for temporary storage in the memory devices 42, 44, 46 as well as for further processing. For the post-treatment of the sampling values 18, 20, 22 in the post-treatment device 48 of the component 30, for example for the interpolation or low-pass filtering of the time-discrete and value-discrete signals, the sampling values 20, 22 are passed to the component 30. In addition the sampling values 20 are passed from the memory control device 38 via a signal line 54 to a channel control device 52, which combines the sampling values 38 and passes them on via a signal line 56 to the memory control device 36 of the component 30 comprising the post-treatment device 48. In the same way the sampling values 22 are passed from the memory control device 40 via a signal line 58 to a channel control device 60, which combines the sampling values 22 and passes them on via a signal line 62 to the memory control device 36 of the component 30 comprising the post-treatment device 48.

The sampling values 20, 22 are coupled into the component 30 by means of the channel control devices 52, 60 and are arranged in a sequence by means of the memory control device 36 in such a way as to compensate for a time-delay of the sampling values 20, 22 that were generated, time-displaced with respect to the sampling values 18, in the sampling devices 10, 12, and so that a signal 64 reproducing the analog signal 6 is generated from the sequence of the sampling values 18, 20, 22. As a result of this the signal 64 is passed via a signal line 66 to the input side of the post-treatment device 48. The post-treatment device 48 passes a post-treated signal 68 obtained from the signal 64, via a signal line 70 connecting the post-treatment device 48 and the display device 50, to the display device 50 for the representation of the signal 68 to be reproduced.

Figure 2:
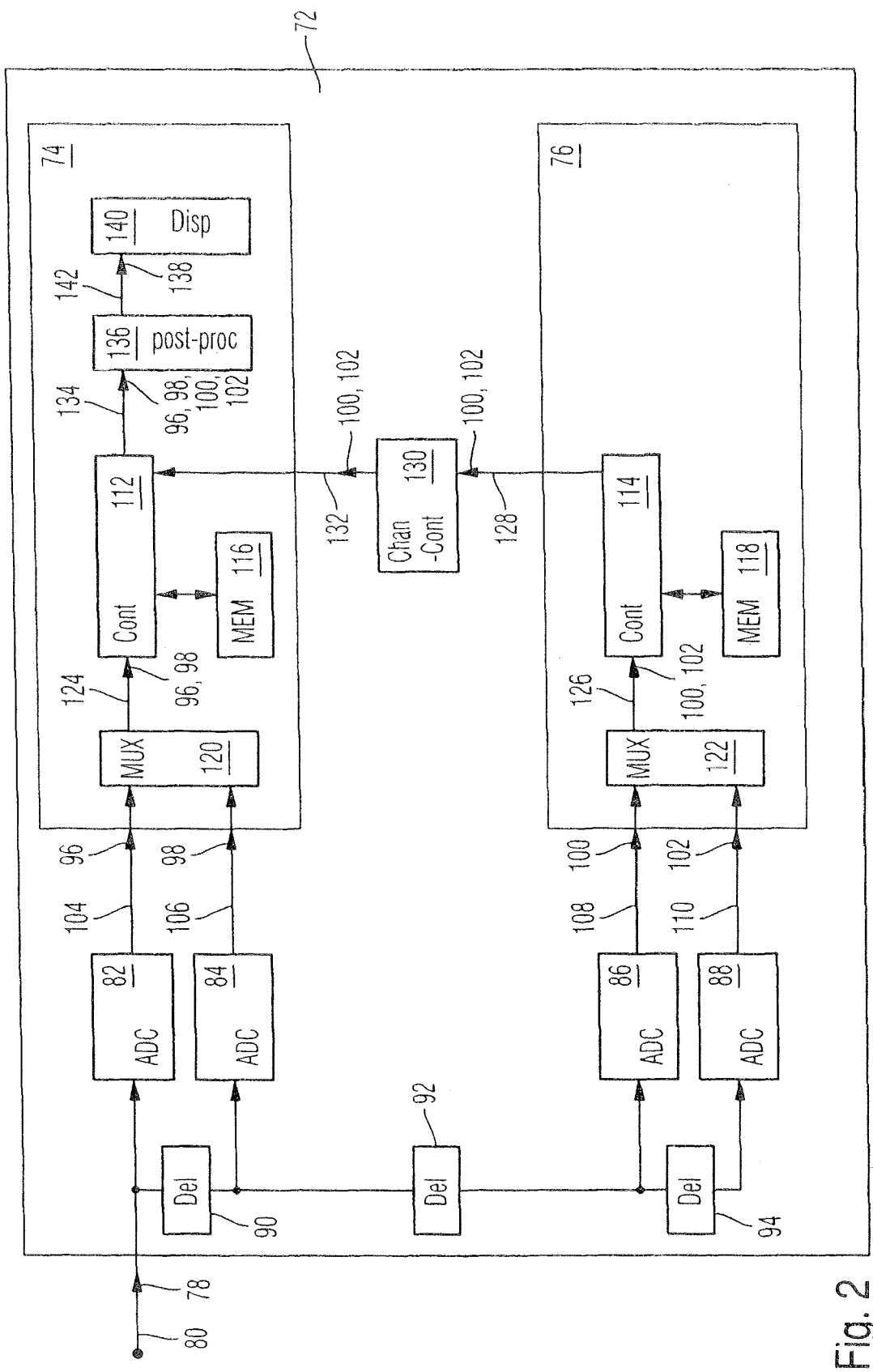
FIG. 2 shows a second embodiment of an arrangement with a cascade of two multiplexer devices connected to sampling devices, and comprising components for recording measured sampling values in the components and for a post-processing of the sampling values in one of the components, according to an exemplary embodiment.

FIG. 2 shows in a second embodiment an arrangement 72 with two cascade-arranged components 74, 76. A monitored signal 78 is again fed in via an input line 80 to the arrangement 72. Furthermore the arrangement 72 includes sampling devices 82, 84, 86, 88. The signal 80 is fed to the sampling device 82 on the input side without any time-delay, for coupling into the arrangement 72. In contrast to this the signal 80 fed to the input side of the sampling device 84 is time-delayed at a time-delay device 90 connected upstream of the sampling device 84. The signal 80 fed to the input side of the sampling device 86 and the sampling device 88 is time-delayed at the time-delay device 90 and in addition at a time-delay device 92 and again at a time-delay device 94.

In contrast to the arrangement in the first embodiment, sampling values 96, 98, 100, 102 identified by arrows in FIG. 2 are not passed to four individual components, but to the two cascade-arranged components 74, 76 via signal lines 104, 106, 108, 110.

The components 74, 76 comprise respectively a memory control device 112, 114 and respectively a memory device 116, 118 connected to the latter, as well as in addition respectively a multiplexer device 120, 122, to the input side of which are fed the sampling values 96, 98 of the sampling devices 82, 84 and the sampling values 100, 102 of the sampling devices 86, 88. The multiplexer device 120, 122 passes on the sampling values 96, 98, 100, 102 at the output side to the memory control device 112, 114 via a signal line 124, 126.

The sampling values 100, 102 are fed from the memory control device 114 via a signal line 128 to a channel control device 130. The channel control device 130 collects the sampling values 100, 102 and couples these via a signal line 132 with the component 74, for combination with the sampling values 96, 98 in the memory control device 112.

The sampling values 96, 98, 100, 102 arranged in sequence with respect to one another with the aid of the memory control device 112 and the channel control device 130 are fed from the memory control device 112 via a signal line 134 to a post-treatment device 136 provided in the component 74. The post-treatment device 136 in turn passes a post-treated signal 138 obtained from the sampling values 96, 98, 100, 102, via a signal line 142 connecting the post-treatment device 136 and a display device 140, to the said display device 140 for the representation of the signal 138 reproducing the analog signal 78.

The invention is not restricted to the embodiments illustrated in the drawings, and in particular not to the cascade arrangement of two or three components, i.e. more than three components can also be cascaded. All the features described hereinbefore and illustrated in the drawings can be combined with one another as desired.

The invention claimed is:

1. A system for representing a signal on a display device, comprising:
    a first sampling device configured to receive the signal and to generate first sampling values;
    at least one second sampling device configured to receive a time-delayed version of the signal and to generate second sampling values;
    a first memory control device, of a first component, configured to receive the first sampling values;
    a second memory control device of a second component, the second component being connected to the second sampling device and configured to receive the second sampling values, wherein the second memory control device transmits the second sampling values to the first memory control device;
    a channel control device, coupled to the first memory control device and to the second memory control device, configured to collect the second sampling values of the second sampled signal and to provide the second sampling values to the first memory control device;
    wherein the channel control device is separate and distinct from the first component and the second component;
    wherein the first sampling values and the second sampling values are arranged in order with respect to one another in the first memory control device; and
    a post-treatment device located within the first component, and configured to receive and to process the ordered arrangement of the first sampling values and the second sampling values from the first memory control device, wherein the post-treatment device is connected to the display device configured to display a representation of the signal.

2. A system according to claim 1, wherein a first memory device is provided in the first component and a second memory device is provided in the second component, in which memory devices are temporarily stored the first sampling values and the second sampling values, respectively.

3. A system according to claim 1, wherein one of the first component and the second component includes a multiplexer device which serves to pass on to one of the first memory control device and the second memory control device, respectively, a plurality of the sampling values of one of the first and second sampled signals that are fed to the first component and the second component, respectively, and which signals are sampled in a time-displaced manner with respect to one another.

4. A system according to claim 1, wherein the first sampling device and the second sampling device each include an analog/digital converter.

5. A method for representing a signal on a display device, comprising:
    sampling the signal without a time-delay to generate a first sampled signal;
    sampling the signal with a time-delay to generate a second sampled signal;
    feeding first sampling values of the first sampled signal to a first memory control device of a first component;
    feeding second sampling values of the second sampled signal to a second memory control device of a second component;
    collecting the second sampling values of the second sampling signal by a channel control device connected between the first memory control device of the first component and the second memory control device of the second component, wherein the channel control device is separate and distinct from the first component and the second component;
    providing, by the channel control device, the second sampling values of the second sampled signal to the first memory control device;
    arranging the first sampling values and the second sampling values in order with respect to one another in the first memory control device;
    outputting, by the first memory control device, the ordered arrangement of the first sampling values and the second sampling values to a post-treatment device located within the first component;
    processing the output of the first memory control device in the post-treatment device located within the first component; and
    displaying the processed output of the first memory control device on the display device as a representation of the signal.

6. A method according to claim 5, wherein the first sampling values of the first sampled signal fed to the first memory control device of the first component and the second sampling values of the second sampled signal fed to the second memory control device of the second component are temporarily stored in the first component and in the second component, respectively.

7. A method according to claim 5, wherein one of the first sampling values of the first sampled signal and the second sampling values of the second sampled signal are sampled in a time-displaced manner with respect to one another, are fed to one of the first component and the second component, respectively, and are passed via a multiplexer device to one of the first memory control device and the second memory control device, respectively.

* * * * *